(12) United States Patent
Boldt

(10) Patent No.: US 7,117,407 B2
(45) Date of Patent: Oct. 3, 2006

(54) METHOD FOR TESTING A SEMICONDUCTOR MEMORY HAVING A PLURALITY OF MEMORY BANKS

(75) Inventor: Sven Boldt, Aschheim (DE)

(73) Assignee: Infineon Technologies AG, Munich (DE)

( * ) Notice: Subject to any disclaimer, the term of this patent is extended or adjusted under 35 U.S.C. 154(b) by 393 days.

(21) Appl. No.: 10/631,356

(22) Filed: Jul. 31, 2003

(65) Prior Publication Data

US 2004/0022101 A1 Feb. 5, 2004

(30) Foreign Application Priority Data

Jul. 31, 2002 (DE) ................ 102 34 944

(51) Int. Cl.
*G11C 29/00* (2006.01)
*G11C 7/00* (2006.01)
(52) U.S. Cl. ............... 714/718; 714/719; 365/201
(58) Field of Classification Search ........... None
See application file for complete search history.

(56) References Cited

U.S. PATENT DOCUMENTS

| | | | |
|---|---|---|---|
| 5,862,502 A * | 1/1999 | Giers ................... 701/71 |
| 6,754,116 B1 * | 6/2004 | Janik et al. ............. 365/201 |
| 6,885,606 B1 * | 4/2005 | Kumazaki et al. ..... 365/230.03 |
| 2002/0083383 A1 | 6/2002 | Lee | |
| 2003/0016578 A1 * | 1/2003 | Janik et al. ............. 365/201 |
| 2003/0142577 A1 * | 7/2003 | Kumazaki et al. ..... 365/230.06 |

* cited by examiner

*Primary Examiner*—Phung My Chung
(74) *Attorney, Agent, or Firm*—Laurence A. Greenberg; Werner H. Stemer; Ralph E. Locher

(57) ABSTRACT

A testing method involves information being written to memory addresses and being read from the memory addresses. The method which logically combines parallel memory bank actuation of the memory addresses using an interleaved mode, which is implemented in relation to disjunct subareas of the memory banks, with one another. This shortens the test time required for testing the semiconductor memory.

9 Claims, 5 Drawing Sheets

FIG 1 Prior Art

| Clock | Command (Bank A) |
|---|---|
| 1 | act-A-adr 1 |
| 2 | 0 |
| 3 | rd-A-adr 1 |
| 4 | 0 |
| 5 | 0 |
| 6 | 0 |
| 7 | pre-A-adr 1 |
| 8 | 0 |
| 9 | act-A-adr 2 |
| 10 | 0 |
| 11 | rd-A-adr 2 |
| 12 | 0 |
| 13 | 0 |
| 14 | 0 |
| 15 | pre-A-adr 2 |
| 16 | 0 |

FIG 2 Prior Art

| Clock | Command |
|---|---|
| 1 | act-A |
| 2 | pre-B |
| 3 | rd-A |
| 4 | act-B |
| 5 | pre-C |
| 6 | rd-B |
| 7 | act-C |
| 8 | pre-D |
| 9 | rd-C |
| 10 | act-D |
| 11 | pre-A |
| 12 | rd-D | ord = {act, pre, rd, wr}
X = {A, B, C, D}

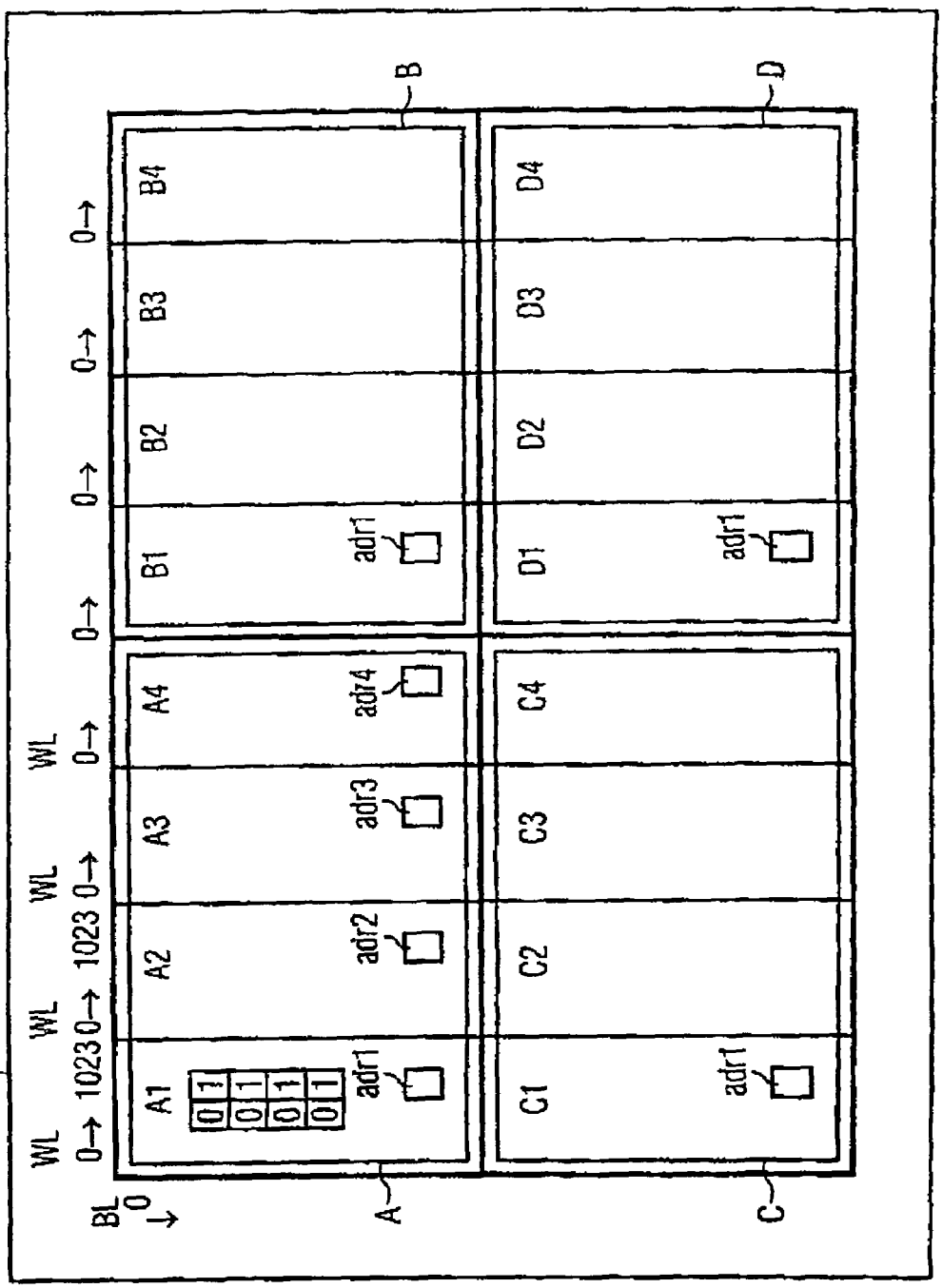

FIG 4

Command Sequence {ord-Xn-adrN}:

| Clock Period | 12A (Bank A) | 12B (Bank B) | 12C (Bank C) | 12D (Bank D) | |
|---|---|---|---|---|---|
| 1 | act-A1-adr 1 | act-B1-adr 1 | act-C1-adr 1 | act-D1-adr 1 | ⎫ |
| 2 | pre-A2-adr 2 | pre-B2-adr 2 | pre-C2-adr 2 | pre-D2-adr 2 | |
| 3 | rd-A1-adr 1 | rd-B1-adr 1 | rd-C1-adr 1 | rd-D1-adr 1 | |
| 4 | act-A2-adr 2 | act-B2-adr 2 | act-C2-adr 2 | act-D2-adr 2 | |
| 5 | pre-A3-adr 3 | pre-B3-adr 3 | pre-C3-adr 3 | pre-D3-adr 3 | |
| 6 | rd-A2-adr 2 | rd-B2-adr 2 | rd-C2-adr 2 | rd-D2-adr 2 | ⎬ 13 |
| 7 | act-A3-adr 3 | act-B3-adr 3 | act-C3-adr 3 | act-D3-adr 3 | |
| 8 | pre-A4-adr 4 | pre-B4-adr 4 | pre-C4-adr 4 | pre-D4-adr 4 | |
| 9 | rd-A3-adr 3 | rd-B3-adr 3 | rd-C3-adr 3 | rd-D3-adr 3 | |
| 10 | act-A4-adr 4 | act-B4-adr 4 | act-C4-adr 4 | act-D4-adr 4 | |
| 11 | pre-A1-adr 1 | pre-B1-adr 1 | pre-C1-adr 1 | pre-D1-adr 1 | |
| 12 | rd-A4-adr 4 | rd-B4-adr 4 | rd-C4-adr 4 | rd-D4-adr 4 | ⎭ |
| 13 | act-A1-adr 5 | act-B1-adr 5 | act-C1-adr 5 | act-D1-adr 5 | ⎫ |
| 14 | pre-A2-adr 6 | pre-B2-adr 6 | pre-C2-adr 6 | pre-D2-adr 6 | |
| 15 | rd-A1-adr 5 | rd-B1-adr 5 | rd-C1-adr 5 | rd-D1-adr 5 | |
| 16 | act-A2-adr 6 | act-B2-adr 6 | act-C2-adr 6 | act-D2-adr 6 | |
| 17 | pre-A3-adr 7 | pre-B3-adr 7 | pre-C3-adr 7 | pre-D3-adr 7 | |
| 18 | rd-A2-adr 6 | rd-B2-adr 6 | rd-C2-adr 6 | rd-D2-adr 6 | ⎬ 14 |
| 19 | act-A3-adr 7 | act-B3-adr 7 | act-C3-adr 7 | act-D3-adr 7 | |
| 20 | pre-A4-adr 8 | pre-B4-adr 8 | pre-C4-adr 8 | pre-D4-adr 8 | |
| 21 | rd-A3-adr 7 | rd-B3-adr 7 | rd-C3-adr 7 | rd-D3-adr 7 | |
| 22 | act-A4-adr 8 | act-B4-adr 8 | act-C4-adr 8 | act-D4-adr 8 | |
| 23 | pre-A1-adr 5 | pre-B1-adr 5 | pre-C1-adr 5 | pre-D1-adr 5 | |
| 24 | rd-A4-adr 8 | rd-B4-adr 8 | rd-C4-adr 8 | rd-D4-adr 8 | ⎭ |
| | 13A, 14A | 13B, 14B | 13C, 14C | 13D, 14D | |

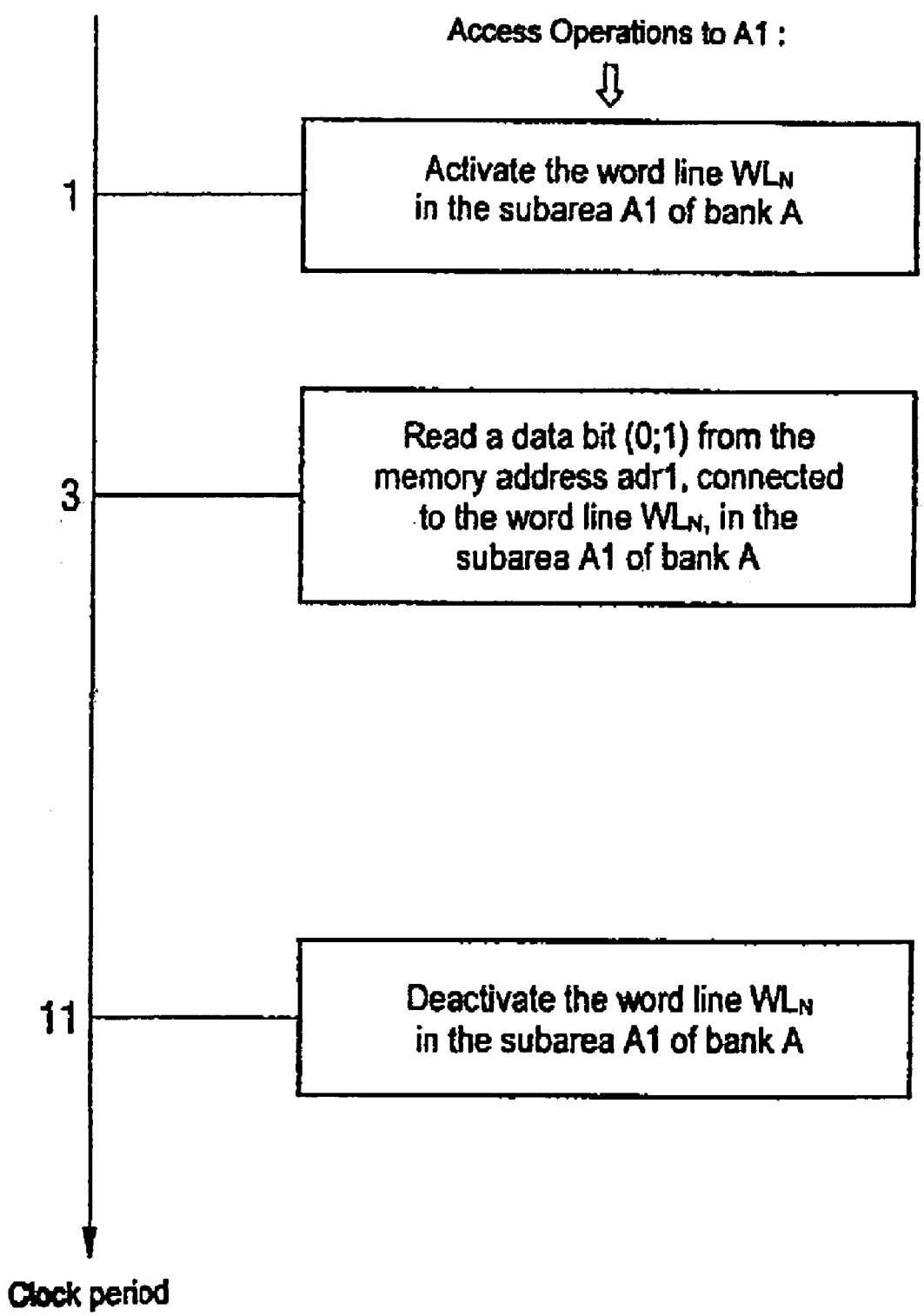

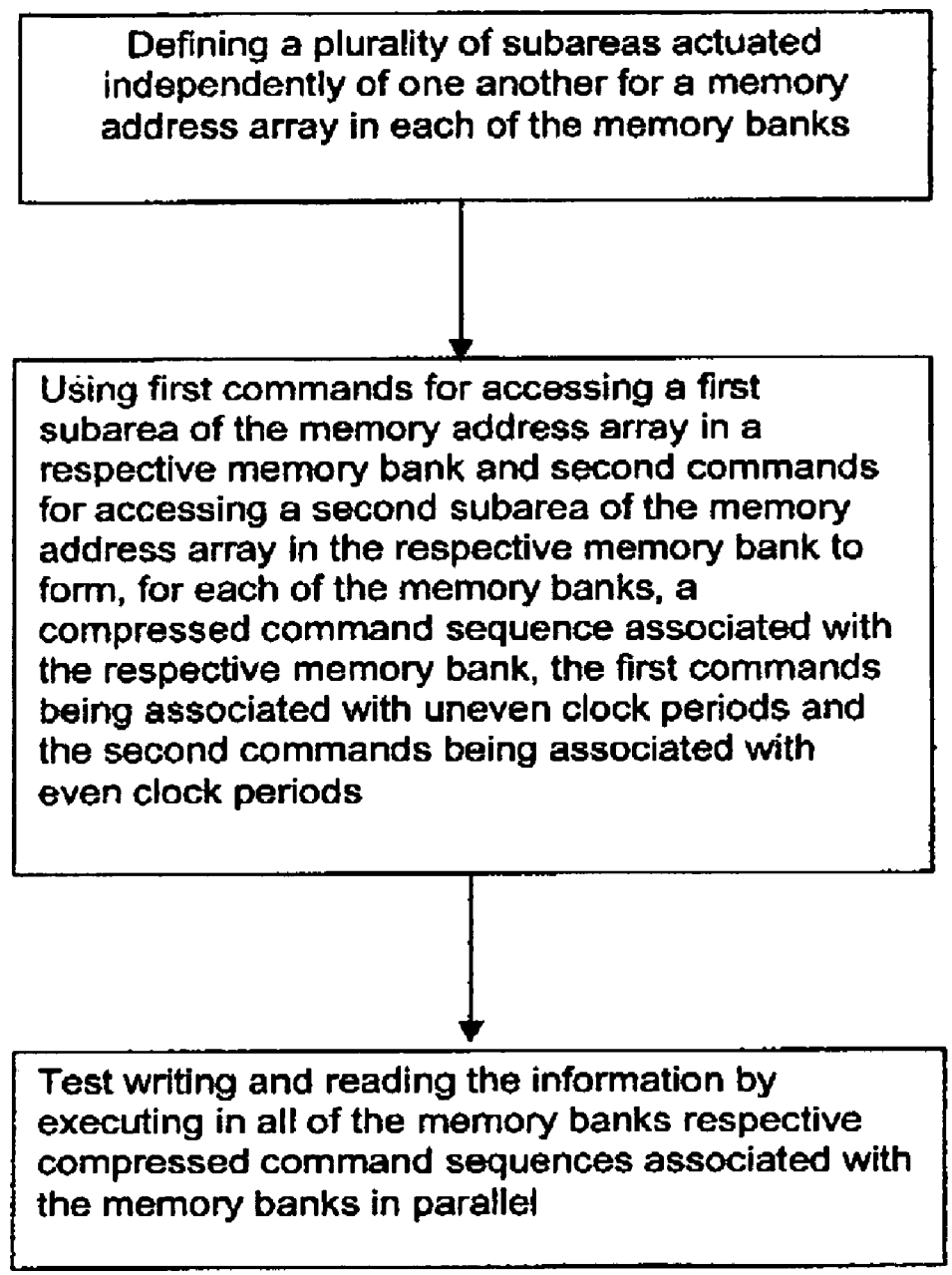

METHOD FOR TESTING A SEMICONDUCTOR MEMORY HAVING A PLURALITY OF MEMORY BANKS

BACKGROUND OF THE INVENTION

Field of the Invention

The invention relates to a method for testing a semiconductor memory having a plurality of memory banks, with testing involving information being written to memory addresses and/or being read from the memory addresses.

Integrated semiconductor memories, particularly volatile semiconductor memories such as dynamic random access memories (DRAMs), are tested following their manufacture in order to check trouble-free operation of the semiconductor memory. In this context, testing involves write and read operations to the memory addresses in the semiconductor memory taking place, which checks whether information written to the semiconductor memory is stored correctly or is lost. The reliability of storage can be very different in the various memory cells in a semiconductor memory, which is why it is necessary to test a large number of memory cells, ideally every memory cell. Since the susceptibility to error of storage depends not just on the geometrical precision of the individual memory cell, but also on surrounding currents, which are variable according to the storage state of the adjacent memory cells, it is not enough to test the reliability of each memory cell just once. Normally, test experiments need to be performed for various geometrical patterns of stored data bits in order to test the susceptibility to error of the individual memory cells on the basis of changing electrical environmental conditions.

Operating such a semiconductor memory in the test mode is time consuming. In order to shorten the test time, it is normal practice in a semiconductor memory having a plurality of memory banks to test all the memory banks at the same time, for example. In the case of a semiconductor memory having four memory banks, this speeds up the test procedure to a certain extent. Alternatively, the time required for accessing a memory cell can also be reduced by an "interleaved" mode in the static mean. This mode makes use of the fact that the commands required for accessing a memory cell are respectively executed at least two clock periods apart from one another (in some cases, technical process reasons mean that even greater intervals of time are necessary between successive commands for accessing a particular memory cell). Thus, by way of example, a particular word line can be activated, i.e. switched to a voltage state suitable for writing or reading, no earlier than two clock periods after the word line was last switched to its basic state. Similarly, a data bit stored at a memory address can be read no earlier than two clock periods after the word line to which the memory cell in question is connected has been activated. In addition, there are further time constraints prescribed by the configuration and manner of operation of the semiconductor memories. Hence, every second clock period passes without a command being executed. It is not possible to assign an unused clock period a command which accesses the same memory address as the commands which are executed for the last previous or for the next successive clock period; this cannot be tolerated with the manner of operation of semiconductor memories today. Since time-saving reasons mean that a plurality of memory cells are often accessed simultaneously, i.e. the whole memory area of a memory bank, this time restriction also applies to the entire memory address array in a memory bank.

The "interleaved" mode makes use of the fact that there is no such relationship for the storage operations on various memory banks. It is therefore possible to execute commands in successive clock periods alternately in the first bank and in a second memory bank. This results in a command chain that alternately addresses two or more memory banks, achieving actuation of the memory banks at interleaved times. The use of unused clock periods allows the test procedure to be sped up by a maximum factor of two.

However, the method has the drawback that in one particular clock period it is no longer possible to access all four memory banks simultaneously. Parallel actuation of all the memory banks during parallel memory bank operation cannot be tolerated with the "interleaved" mode, in which although commands are executed in relatively short intervals of time of usually one clock period, only a single memory bank is accessed in each case. The "interleaved" mode therefore results only in limited acceleration of the test mode as compared with parallel memory bank actuation.

SUMMARY OF THE INVENTION

It is accordingly an object of the invention to provide a method for testing a semiconductor memory having a plurality of memory banks that overcomes the above-mentioned disadvantages of the prior art methods and devices of this general type, which provides a fast method for testing a semiconductor memory having a plurality of memory banks.

With the foregoing and other objects in view there is provided, in accordance with the invention, a method for testing a semiconductor memory having a plurality of memory banks. The testing involves information being written to memory addresses and/or being read from the memory addresses. The method includes defining a plurality of subareas actuated independently of one another for a memory address array in each of the memory banks, and using first commands for accessing a first subarea of the memory address array in a respective memory bank and second commands for accessing a second subarea of the memory address array in the respective memory bank to form, for each of the memory banks, a compressed command sequence associated with the respective memory bank. The first commands being associated with uneven clock periods and the second commands being associated with even clock periods and being inserted between the first commands. The information is written and/or read by executing in all of the memory banks respective compressed command sequences associated with the memory banks in parallel.

The invention provides a method that combines an "interleaved" mode with a parallel memory bank test mode. The memory address area of each memory bank is divided into subareas that are actuated independently of one another during testing. Therefore, no longer is a memory bank in its entirety accessed, but rather just a subarea of the memory bank. This involves at least each memory bank having a first subarea and a second subarea defined which contain sets of memory addresses that are disjunct from one another (and from any further subareas). The invention makes this division for all memory banks. From a technical point of view, the division is implemented by the type of actuation circuit used to operate the semiconductor memory in the test mode.

In line with the invention, a command sequence containing first and second commands which access the first or the second subarea of the memory address array in the respective memory bank is formed for each memory bank. The command sequence is in a form such that for uneven clock periods the commands accessing the first subarea are executed and for even clock periods the commands accessing the second subarea are executed; in this case, the latter are inserted between the commands accessing the first subarea. This produces a command sequence containing first and second commands that access various subareas of a memory bank. For each clock period, only one particular subarea is accessed. By way of example, a word line is opened only in one subarea, or bit lines are read only in one subarea. Under no circumstances, however, are word lines from a plurality of subareas opened in a particular clock period, for example; an appropriate form of the test apparatus for testing the semiconductor memory prevents this.

In line with the invention, the information is written and/or read by virtue of the compressed command sequences, containing the first and second commands, respectively associated with the memory banks in question being executed in parallel, i.e. simultaneously, in all the memory banks. The command sequences formed using the first and second commands, which command sequences can have second commands inserted between first commands in even clock periods, allow a kind of interleaved mode in relation to the disjunct subareas of a single memory bank. Whereas conventionally an interleaved mode is known only in relation to different memory banks, the invention proposes an interleaved mode for different subareas of the memory-bank-internal address array. The invention implements the interleaved mode on all the memory banks of the semiconductor memory in parallel. By way of example, a respective word line (or a group of word lines) is opened in a first clock period in all four memory banks within a respective first subarea of the memory banks. In the next clock period, data bits are written to second subareas of all four memory banks, for example. In the subsequent clock period, memory cells are read in the first memory areas of all four memory banks. The inventive method thus allows a parallel memory bank mode and at the same time utilization of the clock periods which are conventionally unused in the parallel bank mode, which shortens the test time. Acceleration by a factor of up to 2.0 is achieved in comparison with the parallel memory bank manner of operation; in comparison with the conventional interleaved mode, time is shortened by a factor of up to 4.0.

The command sequences, each of which is executed on a particular memory bank, do not exclusively need to contain the first and second commands, which access the first and second subareas, but can also contain further commands, which access further disjunct subareas and are likewise inserted between the first commands. In all cases, however, inserting commands which access different disjunct subareas of a memory bank into one another over time results in compressed command sequences that speed up the testing of the semiconductor memory.

Preferably, provision is made for the memory address array in each memory bank to be divided into four subareas and for the compressed command sequences to be formed such that in uneven clock periods either the first subarea or a third subarea and in even clock periods either the second subarea or a fourth subarea of the memory address array in the respective memory bank is accessed. In this context, the memory address array in a memory bank is divided into four subarrays of equal size that are actuated exclusively individually in a prescribed clock period. This involves the formation of two groups of subareas. The subareas in the first group are addressed exclusively in even clock periods; the remainder exclusively in uneven clock periods. Taking into account the minimum intervals of time between successive commands which access the same subarea of the address array, the compressed command sequence can now be formed by distributing the first and third commands over the uneven clock periods on the basis of the technically prescribed minimum intervals of time between commands which access the same subarea. Accordingly, the second and fourth commands, which access the second and fourth subareas, are distributed over the even clock periods. The result is a compressed command sequence whose commands address the various subareas of the bank-internal address array in alternating or different order. Similarly, the bank-internal memory address array can also be divided into a number of $2n$ disjunct subareas. In this context, it is necessary to allow for an increasing number of time constraints, which can result in time periods in which it is not yet possible to execute a command, because an adequate interval of time for accessing the subareas has not yet been reached in the previous clock periods. In all cases, however, significant acceleration can be achieved by making use of the uneven clock periods as well.

Preferably, provision is made for the order of the commands alternately accessing a plurality of subareas of the memory address array in the respective memory bank to have been chosen within the compressed command sequences such that each clock period has an associated command which accesses one of the subareas of the respective memory bank.

In one development of the inventive method, each command sequence associated with a memory bank contains a succession of command blocks in which any command block contains commands for actuating a respective memory address from each subarea of the memory address array in the respective memory bank. In this context, the command sequence associated with a memory bank is formed in the form of a sequence of command blocks in which each command block accesses all the subareas at least once, specifically accesses one memory address from every subarea of the address array. In the case of four subareas per memory bank, each command block therefore contains commands that are used to read, by way of example, one data bit of a memory address in each subarea. For such reading, a corresponding word line needs to be activated, a corresponding bit line needs to be read and the corresponding word line needs to be closed again, respectively. For each memory address, three respective commands are provided, i.e. a total of twelve commands for the four memory addresses of the four subareas. Within the command block, the commands are inserted into one another such that a command can be executed in each clock period. To this end, by way of example, the first subarea can be accessed only in uneven clock periods, and also only if this is tolerable with the function-dependent minimum intervals of time between successive access operations to the same (first) subarea of the memory bank. Following execution of the command block which contains twelve commands, a further block of commands is executed, these being used to read four further memory cells, each containing four different subareas of the bank-internal address array.

Preferably, each command sequence contains commands for writing or for reading information and contains commands for activating or for deactivating word lines. Provision can likewise be made for only some of the commands to be used, for example if all the cells contain written information in a particular test phase and only the results of reading are of interest.

In one preferred embodiment, the memory address array in each memory bank is divided, in a direction perpendicular to the path of word lines, into a plurality of independently actuable subareas that are accessed alternately by the command sequence associated with the respective memory bank. In this context, the address area of the word lines is divided into four subareas, for example, and is actuated in test mode such that only the memory addresses in a single subarea can be actuated in a fixed clock period. By way of example, in the case of four subareas, no more than one quarter of the word lines are opened or closed simultaneously per clock period. Alternatively, provision can be made for the semiconductor memory to be actuated such that the bank-internal memory address array is divided into a plurality of disjunct subareas in the direction perpendicular to the path of the bit lines, that is to say in the order of the bit line numbers.

Preferably, the command sequences associated with the memory banks are configured such that each command for reading a memory address follows precisely two clock periods after a command which activates that word line to which the memory address to be read is connected. In this context, the "RAS-CAS delay time" (Row Address Sequence-Column Address Sequence) of two clock periods is utilized in the best possible manner; unnecessary longer time delays between activation of a word line and reading of a memory address connected thereto do not arise. Similarly, operation of a semiconductor memory takes into account further function-dependent minimum time intervals when the inventive command sequence contains test commands that access different subareas of a memory bank.

The inventive method can, in principle, be used to test any kind of semiconductor memory. Preferably, however, dynamic semiconductor memories, particularly dynamic read/write memories, are tested. In this case, the clock period prescribed essentially by the refresh time is taken as a basis for the inventive test method. Similarly, however, read-only memories can also be tested using the inventive method.

Other features which are considered as characteristic for the invention are set forth in the appended claims.

Although the invention is illustrated and described herein as embodied in a method for testing a semiconductor memory having a plurality of memory banks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a table showing a first conventional command sequence for testing a semiconductor memory in a parallel memory bank mode of operation;

FIG. 2 is a table showing a second conventional command sequence in an interleaved mode for the memory banks;

FIG. 3 is a block diagram of a semiconductor memory having four memory banks;

FIG. 4 is a table showing four command sequences used in testing the semiconductor memory from FIG. 3 according to the invention;

FIG. 5 is an excerpt from a command sequence from FIG. 4; and

FIG. 6 is a flow chart showing the steps of the testing method according to the invention.

DESCRIPTION OF THE PREFERRED EMBODIMENT

Referring now to the figures of the drawing in detail and first, particularly, to FIG. 1 thereof, there is shown a conventional command sequence based on a typical test-mode memory access for reading stored information. The command sequence shown extends over 16 clock cycles; the commands associated with the 16 clock periods are shown in the right-hand column and each access a bank A in a semiconductor memory. The command sequence contains two blocks of eight clock periods each, with a memory address adr1 being accessed in the first block and a second memory address adr2 in bank A being accessed in the next block. It can be seen that a command is executed in only a relatively few clock periods; a zero identifies a clock period in which no command is sent. In clock period 1, the word line to which the memory address adr1 is connected is activated in memory bank A, as expressed by the command abbreviation "act-A-adr1". In clock period 2, it is not yet possible to execute a command that accesses the memory address adr1. The configuration and manner of operation of an integrated semiconductor memory do not allow further access to the memory bank A until two clock periods after the first access, i.e. in clock period 3. At that point, the memory content at memory address adr1, i.e. a digital information item zero or one—is read (rd for read). There then come three further clock cycles in which further access to the memory bank A is not yet possible. Thus, by way of example, the read data bit from the address adr1 first needs to be forwarded, which requires two clock periods. The next access to the memory bank A comes in clock period 7, in which the word line to which the memory address adr1 is connected is deactivated again (pre for precharge). In this way, further memory addresses are read sequentially; first, the memory address adr2 (clock periods 9 to 16). Using a command cycle as shown in FIG. 1, which can be of differing configuration according to read access or write access or combined read/write access, but always contains idle clock periods, it is also simultaneously possible to access a plurality of memory banks as well. However, there is then also the drawback that test time is taken up on account of the idle clock periods, in which no command is executed.

FIG. 2 shows another conventional command sequence corresponding to an interleaved mode, in which various memory banks A, B, C and D are accessed alternately. In clock period 1, a word line in memory bank A is activated. In clock period 2, a word line in memory bank B is deactivated. In clock period 3, a memory cell in memory bank A is read. After that, a word line in memory bank B is activated in clock period 4. There follow further commands, in which the memory banks C and D are also accessed. The word line activated in clock period 1 from memory bank A is finally deactivated again in clock period 11. The command sequence, extending over 12 clock periods, now contains no further idle clock periods; in each clock period, a command is executed which accesses one of the memory banks A, B, C, D in the semiconductor memory. However, this method has the drawback that a parallel memory bank mode, in which all four memory banks are accessed in each clock period, is not possible. The necessary test time can therefore be shortened only to a limited extent using this method.

FIG. 3 shows a semiconductor memory 10 having four memory banks A, B, C and D. The semiconductor memory is preferably a DRAM, i.e. a volatile semiconductor memory. It can also have 2 n memory banks, where n is a natural number. The semiconductor memory shown can be tested either using a conventional test method or using a test method in accordance with the invention, both cases involving the performance of a function test in which digital information (0; 1), shown by way of example in the left-hand part of the memory bank A, is written and/or read in a test mode. To simplify matters, it is assumed that each memory address in a memory bank can store precisely one data bit. Any greater bus size in the semiconductor memory is also conceivable, however.

In a conventional test method as shown in FIG. 1, all four memory banks A to D are accessed in parallel, the commands shown in FIG. 1 being executed in respectively identical clock periods in all four banks, but being separated by a large number of idle clock periods.

In a conventional test method as shown in FIG. 2, each clock period involves access to a different semiconductor memory A, B, C or D than in the previous clock period. Parallel testing of all four memory banks is not possible in this case.

The inventive test method involves access both in parallel memory bank mode and in an interleaved mode, the interleaved mode being implemented not in relation to the different memory banks (A to D) but in relation to subunits A1, A2, A3, A4, B1, . . . D4 of the memory banks, which are actuated independently of one another in the inventive method. By way of example, each memory bank has four subareas of the memory-bank-internal memory address array defined for it, for example the subareas A1, A2, A3 and A4 for the memory bank A. The memory address array can be divided into subareas by limiting the respective row or column address area. By way of example, the subareas A1 to A4 are associated with disjunct sets of word line addresses in FIG. 3; for example, instead of the entire memory bank A with, by way of example, 4096 word line addresses, four subareas A1 to A4 with 1024 word line addresses each are activated independently of one another. This type of actuation during test-mode read/write access, read access or write access allows an interleaved mode to be implemented for the various subareas in the same memory bank A, in which case the test time in the entire semiconductor memory 10 is shortened. The division of the memory banks into subareas shown in FIG. 3 is merely by way of example. Alternatively, the subareas can be assigned to disjunct bit line address areas, for example. In the exemplary embodiment shown, however, the subareas of the bank-internal address array or in an order based on word line addresses; each subarea A1 to A4 extends over 1024 word line addresses.

FIG. 4 shows command sequences in an inventive method for testing the semiconductor memory 10 shown in FIG. 3, i.e. a semiconductor memory having four memory banks A to D. The table shown in FIG. 4 shows how and which subareas A1, A2, A3, A4, B1, . . . , D4 in the memory banks are accessed in the various respective clock periods. The memory bank A has the associated command sequence 12A. In clock period 1, a word line to which an address adr1 is connected is activated in the subarea A1. In the same clock period 1, a word line for the respective first subarea is also opened in corresponding subareas B1, C1 and D1 of the remainder of the memory banks. Accordingly, the arrays A1, BE, C1 and D1 are accessed in clock period 1 in FIG. 3. In clock period 2 (see FIG. 4), a respective word line to which a respective second memory address adr2 is connected is deactivated in the subareas A2, B2, C2 and D2 of the memory banks A, B, C, D. Accordingly, the subareas A2, B2, C2 and D2 are accessed in clock period 2 in FIG. 3. In clock period 3 (see FIG. 4), the subareas A1, BE1, C1 and D1 are again accessed by reading the stored information at the memory address adr1 in the respective memory banks A to D. In line with FIG. 3, the bank-internal address subareas A1, BE1, C1 and D1 are thus accessed in clock period 3. As shown merely by the type of access during the first three clock periods, the inventive test-mode access to the semiconductor memory first takes place in parallel memory bank mode, since all four memory banks are accessed in each clock period. Secondly, an interleaved mode is implemented for the various subareas within the memory banks; by way of example, in memory bank A, subarea 1 is addressed in clock cycle 1, subarea A2 is addressed in clock period 2, and subarea A1 is again addressed in clock period 3. The address adr1 is accessed in clock period 1 and in clock period 3, as can be seen in FIG. 4 from the command sequence 12A for the memory bank A in clock periods 1 and 3. Hence, for the individual memory address adr1, a time difference of two clock periods also continues to be observed between activation of a word line and reading of the memory address; the same time constraints are observed as in the case of a conventional method as shown in FIG. 1 (clock periods 1 and 3). However, the invention provides for the idle clock periods that can be seen in FIG. 1 to be avoided by the memory-bank-internal interleaved mode implemented for the subareas of the bank-internal address array. Thus, although no access is effected in the subarea A1 again until clock period 11, when the word line is deactivated, as can be seen from FIG. 4 in the command sequence 12A in clock period 11, a respective different subarea A2, A3 or A4 in the same memory bank A is accessed in each previous clock period 4 to 10, which results in that no idle clock periods arise.

The inventive test-mode access is effected in a parallel memory bank fashion, so that for each memory bank A, B, C, D a corresponding command sequence 12A, 12B, 12C, 12D is formed (FIG. 4) in which the first commands, which access the first subarea A1, B1, C1, D1 of the respective memory bank A, B, C, D, are associated exclusively with uneven clock periods 1, 3, 11, 13, 15, 23 and in which second commands, which access second subareas A2, B2, C2, D2 of the respective memory bank, are associated exclusively with even clock periods 2, 4, 6, 14, 16, 18 and are inserted between the first commands. The commands accessing the third and fourth subareas A3, A4, . . . D3, D4 are also inserted between the first commands. The order of the commands accessing the various subareas A1, A2, A3, A4 is chosen such that function-dependent minimum intervals of time are observed between commands which access the same subarea or the same memory address. By way of example, the RAS-CAS delay time (Row Address Sequence-Column Address Sequence-Delay) of two clock periods is observed; the memory address adr1 is accessed (in clock period 3) two clock periods after the corresponding word line is opened (in clock period 1). In the remainder of the subareas A2, A3, A4 too, the steps of opening the word line and of reading a memory cell each take place with an interval of two clock periods, namely in clock periods 2 and 4 (subarea A2), 7 and 9 (subarea A3) and 10 and 12 (subarea A4). A similar situation applies to the other memory banks B, C and D. The memory addresses accessed in a particular clock period do not need to be the same for all the memory banks, as shown in FIG. 4 for the sake of clarity.

The inventive access to the four memory banks A to D requires four command sequences, which are shown in FIG. 4 just for the first 24 clock periods. Each command sequence 12A, . . . , 12D can contain a sequence of successive command blocks 13, 14, . . . with a respective memory cell from each subarea of the memory bank in question being accessed in each block. The method illustrated in FIG. 4 involves a respective memory address being read from each subarea of each memory bank during the first twelve clock periods, for example. In clock periods 13 to 23, sixteen respective further memory addresses are read.

FIG. 5 illustrates some of the commands from FIG. 4. Those commands in the command sequence 12A for the memory bank A are shown which access the first subarea A1 in the memory bank A in order to read a digital data bit of a memory address adr1 from the subarea A1. Along the timeline, the digits for the associated clock periods are shown. In clock period 1, the word line $WL_N$, to which the memory address adr1 is connected, in subarea A1 of the bank A is activated, as shown in FIG. 4 by the command descriptor act-A1-adr1. In clock period 3, the data bit stored at the memory address adr1 is read, as shown in FIG. 4 by the command rd-A1-adr1 in clock period 3 for the command sequence 12A. In clock period 11, the word line $WL_N$ is deactivated again, as shown in FIG. 4 in clock period 11 by the command pre-A1-adr1 in command sequence 12A. FIG. 5 contains those commands that are required for reading the data bits stored at the memory address adr1. The extract shown in FIG. 5 from the command sequence 12A shows that the minimum intervals of time, applicable to semiconductor memories, between commands that access the same memory area are observed. Thus, a time difference $t_{RCD}$ between activation of the word line (in clock period 1) and reading of the memory address adr1 connected thereto (in clock period 3) is two clock cycles. A minimum interval of time between a command for activating a word line (in clock period 1) and closure of the same word line (in clock period 11) of six clock cycles is likewise observed. The CAS latency (Column Address Sequence Latency) of at least two clock periods between the time at which a memory cell is read (in clock period 3) and the time at which the information read is forwarded to the output of the semiconductor memory is likewise observed. In addition, there are other critical parameters which are dependent upon the configuration and manner of operation of integrated semiconductor memories and which govern the manner in which the commands accessing the various subareas of a memory bank are organized in order to form a command sequence containing as few idle clock periods as possible. The specific order of the commands for a particular semiconductor memory is obtained from the prescribed minimum intervals of time and according to the number of subareas of the memory-bank-internal address array that are actuated independently of one another.

I claim:

1. A method for testing a semiconductor memory having a plurality of memory banks, the testing involving test writing of information to memory addresses, reading the information from the memory addresses and checking whether the written information has been stored correctly, which comprises the steps of:
    defining a plurality of subareas actuated independently of one another for a memory address array in each of the memory banks;
    using first commands for accessing a first subarea of the memory address array in a respective memory bank and second commands for accessing a second subarea of the memory address array in the respective memory bank to form, for each of the memory banks, a compressed command sequence associated with the respective memory bank, the first commands being associated with uneven clock periods and the second commands being associated with even clock periods; and
    test writing and reading the information by executing in all of the memory banks respective compressed command sequences associated with the memory banks in parallel.

2. The method according to claim 1, which further comprises:
    dividing the memory address array in each of the memory banks into four subareas; and
    forming the respective compressed command sequences such that in the uneven clock periods one of the first subarea and a third subarea and in the even clock periods one of the second subarea and a fourth subarea of the memory address array in the respective memory bank is accessed.

3. The method according to claim 2, which further comprises dividing the memory address array in each of the memory banks, in a direction perpendicular to a path of word lines, into a plurality of independently actuable subareas which are accessed alternately by the respective compressed command sequence associated with the respective memory bank.

4. The method according to claim 1, which further comprises defining an ordering of commands to alternately access a plurality of subareas of the memory address array in the respective memory bank within the respective compressed command sequences such that each clock period has an associated command accessing one of the subareas of the respective memory bank.

5. The method according to claim 1, which further comprises providing each of the respective compressed command sequences associated with a memory bank a succession of command blocks in which a command block contains commands for actuating a respective memory address from each of the subareas of the memory address array in the respective memory bank.

6. The method according to claim 1, which further comprises providing each of the respective compressed command sequences with commands for one of writing the information and for reading the information and with further commands for one of activating word lines and deactivating the word lines.

7. The method according to claim 1, which further comprises configuring the respective compressed command sequences associated with the memory banks such that each command for reading a memory address follows precisely two clock periods after a command which activates a word line to which the memory address to be read is connected.

8. The method according to claim 1 which further comprises testing a dynamic semiconductor memory as the semiconductor memory.

9. The method according to claim 1, which further comprises testing a dynamic read/write memory as the semiconductor memory.

* * * * *